United States Patent
Xiang

(10) Patent No.: US 10,789,884 B2
(45) Date of Patent: Sep. 29, 2020

(54) ELECTROGENERATED ORGANIC LIGHT-EMITTING DIODE DEVICE, MANUFACTURING METHOD, AND DISPLAY DEVICE THEREOF

(71) Applicant: WUHAN CHINA STAR OPTOELECTRONICS SEMICONDUCTOR DISPLAY TECHNOLOGY CO., LTD., Wuhan, Hubei (CN)

(72) Inventor: Ming Xiang, Hubei (CN)

(73) Assignee: WUHAN CHINA STAR OPTOELECTRONICS SEMICONDUCTOR DISPLAY TECHNOLOGY CO., LTD., Wuhan, Hubei (CN)

( * ) Notice: Subject to any disclaimer, the term of this patent is extended or adjusted under 35 U.S.C. 154(b) by 46 days.

(21) Appl. No.: 16/326,395

(22) PCT Filed: Jan. 4, 2019

(86) PCT No.: PCT/CN2019/070356
§ 371 (c)(1),
(2) Date: Feb. 19, 2019

(87) PCT Pub. No.: WO2020/107649
PCT Pub. Date: Jun. 4, 2020

(65) Prior Publication Data
US 2020/0168148 A1 May 28, 2020

(51) Int. Cl.
*G09G 3/3225* (2016.01)
*H01L 27/32* (2006.01)

(52) U.S. Cl.
CPC ....... *G09G 3/3225* (2013.01); *H01L 27/3209* (2013.01); *H01L 27/3246* (2013.01)

(58) Field of Classification Search
CPC ... G09G 3/3225; H01L 27/3211; H01L 51/56; H01L 27/3218; H01L 27/3216
See application file for complete search history.

(56) References Cited

U.S. PATENT DOCUMENTS

| | | | |
|---|---|---|---|
| 2007/0075310 A1 | 4/2007 | Lee | |
| 2014/0048781 A1* | 2/2014 | Chang | C23C 14/042 257/40 |
| 2014/0284565 A1* | 9/2014 | Park | H01L 51/0013 257/40 |

(Continued)

FOREIGN PATENT DOCUMENTS

| | | |
|---|---|---|
| CN | 104862647 A | 8/2015 |
| CN | 106435483 A | 2/2017 |
| CN | 107068886 A | 8/2017 |

*Primary Examiner* — Gerald Johnson
(74) *Attorney, Agent, or Firm* — Mark M. Friedman

(57) ABSTRACT

An organic electrogenerated light-emitting diode device, manufacturing method, and display device thereof are provided. The method comprises: a first organic common layer and a first light-emitting layer are formed in a pixel region of the array substrate. A opening area of different organic light-emitting material layers are set by adjusting a distance between the fine metal mask and the array substrate, the opening area is proportional to the distance between the fine metal mask and the array substrate. At least a second light-emitting layer is formed on the first light-emitting layer.

10 Claims, 3 Drawing Sheets

(56) References Cited

U.S. PATENT DOCUMENTS

2014/0315339 A1* 10/2014 Kim .................... H01L 51/5221
                                                    438/34
2016/0333457 A1   11/2016 Ma et al.
2020/0006443 A1*  1/2020 Park .................... H01L 27/3262

* cited by examiner

ELECTROGENERATED ORGANIC LIGHT-EMITTING DIODE DEVICE, MANUFACTURING METHOD, AND DISPLAY DEVICE THEREOF

FIELD OF INVENTION

The disclosure relates to a manufacturing field of displays, and more particularly to an organic electrogenerated light-emitting diode device, manufacturing method, and display device thereof.

BACKGROUND OF INVENTION

Normally, in some disclosure scenarios of getting mixed light of desired color needing to mix several kinds of organic light-emitting materials. In an existing technology, kinds of light-emitting materials that have a first carrier mobility greater than a second first carrier mobility is used. When changing an area ratio between a second light-emitting layer and a first light-emitting layer, mixed color light can be generated. However, in order to obtain different area ratio between a second light-emitting layer and a first light-emitting layer, in several times of evaporation processes of second light-emitting layer, fine metal masks (FMMs) with different sizes hole are necessarily used. Thus, because FMMs are frequently used in manufacturing processes, process difficulty and production costs both obviously increase.

Therefore, it is necessary to improve aiming at the defects in existing technology.

SUMMARY OF DISCLOSURE

The present disclosure provides an organic electrogenerated light-emitting diode device, manufacturing method and display device thereof, thereby reducing use times of fine metal masks (FMMs), and decreasing process difficulty and production costs of manufacturing processes.

To achieve the above object, the technical schemes of the present disclosure provide as follows.

The present disclosure provides a manufacturing method of an organic electrogenerated light-emitting diode device. The organic light-emitting diode device is configured to achieve a mixed light-emitting of at least two kinds of organic light-emitting material layer at a predetermined light-emitting ratio, and the manufacturing method comprising following steps.

At step S10, an array substrate is provided, wherein a pixel region of the array substrate comprises a first organic common layer and a first light-emitting layer.

At step S20, a fine metal mask is aligned with the array substrate correspondingly, and adjusting a distance between the fine metal mask and the array substrate determines opening area of at least two different kinds of organic light-emitting material layer, wherein the opening area is proportional to the distance between the fine metal mask and the array substrate, and at least a second light-emitting layer is formed on the first light-emitting layer.

At step S30, a second organic common layer and a cathode layer are formed on a second light-emitting layer.

In the manufacturing method, the opening area is determined by a ratio of a light-emitting region of each of the at least two kinds of organic light-emitting material layer and a light-emitting area of the first light-emitting layer.

In the manufacturing method, the ratio of the light-emitting area of the first light-emitting layer and the light-emitting region of the organic light-emitting material layer is inversely proportional to the distance between the fine metal mask and the array substrate.

In the manufacturing method, the second light-emitting layer is formed on a surface of the first light-emitting layer, and partially covers the surface of the first light-emitting layer.

In the manufacturing method, wherein the first light-emitting layer and the second light-emitting layer are made of a material having a mobility of a first carrier that is greater than a mobility of a second carrier, and the first light-emitting layer is back of one surface of the second light-emitting layer to receive the first carrier mobility transmitting from the first organic common layer, and the second light-emitting layer is back of one surface of the first light-emitting layer to receive the second carrier mobility transmitting from the second organic common layer.

To achieve the above object, the disclosure also provides an organic electrogenerated light-emitting diode device adopting above method. Wherein the organic electrogenerated light-emitting diode device including at least the first light-emitting layer and the second light-emitting layer. The second light-emitting layer is formed above the surface of the first light-emitting layer, and partially covers the surface of the first light-emitting layer;

There is a predetermined light-emitting area ratio between the light-emitting area of the second light-emitting material layer and the first light-emitting layer.

In the organic electrogenerated light-emitting diode device, the first light-emitting layer and the second light-emitting layer are made of a material which the first carrier mobility is greater than the second carrier mobility.

In the organic electrogenerated light-emitting diode device, a first organic common layer is set in the first light-emitting layer back of one surface of the second light-emitting layer, and a second organic common layer is set in the second light-emitting layer back of one surface of the first light-emitting layer. The first organic common layer is used for receiving the first carrier mobility transmitting from the first light-emitting layer, and the second organic common layer is used for receiving the second carrier mobility transmitting from the second light-emitting layer.

In the organic electrogenerated light-emitting diode device, the first light-emitting layer is covered with the light-emitting area of the organic electrogenerated diode device.

To achieve the above object, the disclosure future provides a display device comprising the organic electrogenerated light-emitting diode device.

The beneficial effects of the disclosure comprise: compared with existing manufacturing methods of organic electrogenerated light-emitting diode device, this disclosure provides an organic electrogenerated light-emitting diode device, its manufacturing method and display device. Light-emitting units with different evaporation area can be obtained by adjusting distance between the fine metal mask and the substrate, and mixed colors light can be realized by adjusting lighting area of different light-emitting materials. It only needs a fine metal mark with one kind of opening using the technical scheme, and it can obviously reduce using time of metal mask (FMM) and production cost. The manufacturing technic only needs one time aligning for using several light-emitting layer to degree process difficulty, and shortens production cycle.

DESCRIPTION OF DRAWINGS

The accompanying figures to be used in the description of embodiments of the present disclosure or prior art will be described in brief to more clearly illustrate the technical solutions of the embodiments or the prior art. The accompanying figures described below are only part of the embodiments of the present disclosure, from which figures those skilled in the art can derive further figures without making any inventive efforts.

DETAILED DESCRIPTIONS OF PREFERRED EMBODIMENTS

The specific embodiments described with reference to the attached drawings are all exemplary and are intended to illustrate and interpret the present disclosure. The directional terms mentioned in the present disclosure, such as "upper," "lower," "front," "rear," "left," "right," "inside," "outside," "top," "bottom," "inside," "outside," "side", just are the directions of the attached drawings. So that, the directional terms are used to illustrate and be understood the present disclosure, are not to limit the present disclosure. And, the similar units are indicated with same marks.

In existing technical of manufacturing method of organic electrogenerated light-emitting diode device, several times of evaporation process using metal mask (FMM) with different size holes increase process difficulty and production cost. The preferred embodiments can solve problems of the defects.

In some disclosure scenarios of getting mixed light of desired color needing to mix several kinds of organic light-emitting materials, this disclosure provides an organic electrogenerated light-emitting diode device, its manufacturing method and display device. This disclosure provides a method that Light-emitting units with different evaporation area are generated by adjusting distance between the fine metal mask and the substrate, and then mixed colors light is also realized.

Figure 1:
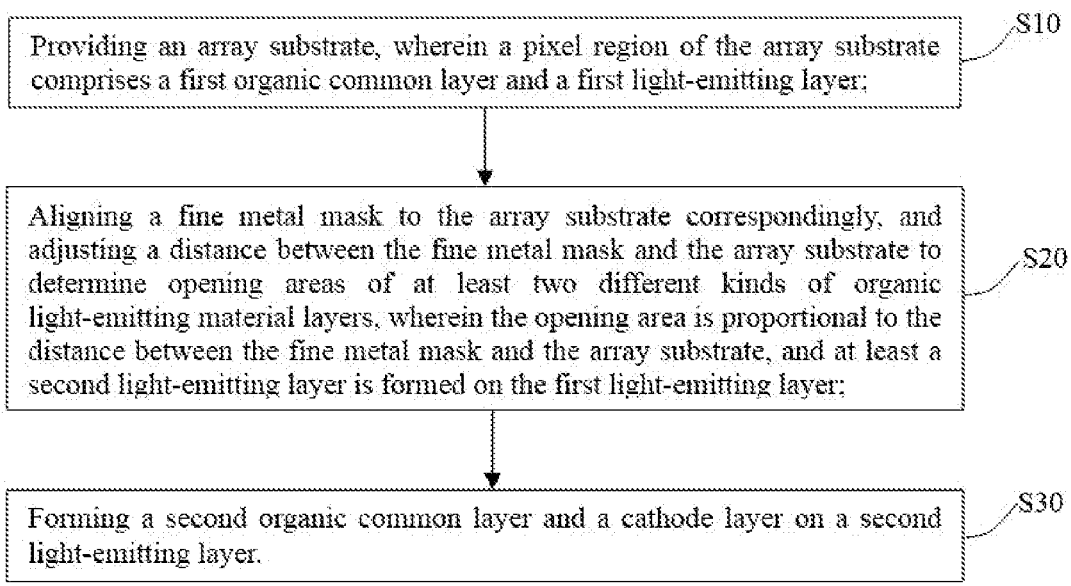
FIG. 1 is a flow chart of a manufacturing method of an organic electrogenerated light-emitting diode device according to an embodiment of the present disclosure.
Figure 2A:
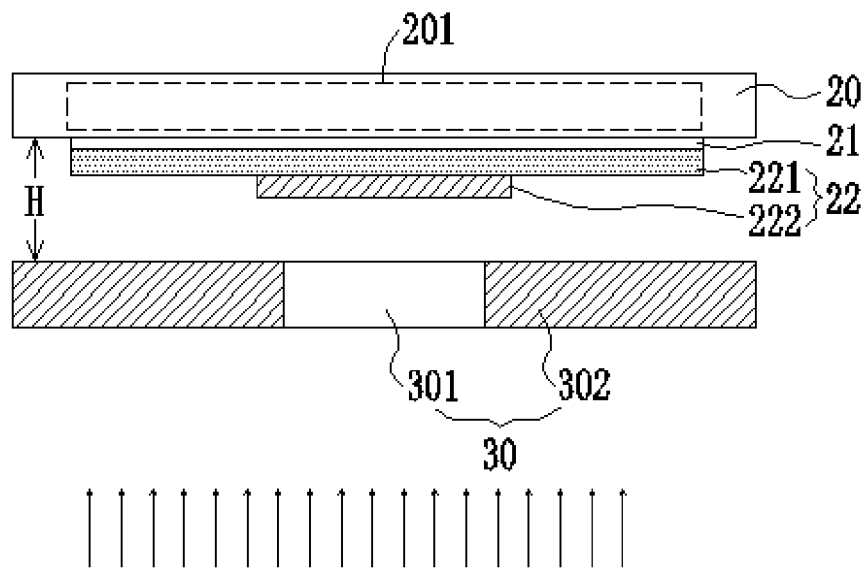
FIG. 2A is a manufacturing method flow schematic diagram of an organic electrogenerated light-emitting diode device according to an embodiment of the present disclosure.

FIG. 1 is manufacturing method flow chart of an organic electrogenerated light-emitting diode device according to an embodiment of the present disclosure. FIG. 2A is a manufacturing method flow schematic diagram of an organic electrogenerated light-emitting diode device according to an embodiment of the present disclosure. The organic light-emitting diode device is configured to achieve a mixed light-emitting of at least two kinds of organic light-emitting material layer at a predetermined light-emitting ratio, the method comprising the steps of:

At step S10, an array substrate is provided, wherein a pixel region of the array substrate comprises a first organic common layer and a first light-emitting layer.

As shown in FIG. 2A, an array substrate 20 for thin film transistor (TFT) layer is provided, the array substrate 20 comprising pixel area 201, and a first organic common layer 21 and a first light-emitting layer 220 are formed in the position of the pixel area 201 by evaporating with opening metal mark. In an embodiment, there are no limitations of manufacturing method of the first organic common layer 21 and the first light-emitting layer 220. The array substrate 20 also comprises other layer, such as a buff layer. And no further description is provided herein.

At step S20, a fine metal mask is aligned with the array substrate correspondingly, and adjusting a distance between the fine metal mask and the array substrate to determine opening area of at least two different kinds of organic light-emitting material layer, wherein the opening areas are proportional to the distance between the fine metal mask and the array substrate, and at least a second light-emitting layer is formed on the first light-emitting layer.

As shown in FIG. 2A, aligning a fine metal mask 30 to the array substrate 20 correspondingly, and aligning an opening part 301 of the fine metal mask 30 to the first light-emitting layer 221. Adjusting a distance between the fine metal mask 30 and the array substrate 20 to determine opening area of at least two different kinds of organic light-emitting material layer. The opening area is determined by presetting light-emitting area between every organic light-emitting material layer and the first light-emitting layer 221.

For example, the distance between the fine metal mark 30 and the array substrate 20 is defined as H, and another organic light-emitting layer is evaporated on the array substrate 20 through opening part 301. The Shelter part of the fine metal mark 30 is used to cover part of organic light-emitting material and from a second light-emitting layer 222 in the pixel area 201. And the second light-emitting layer 222 is located on the surface of the first light-emitting layer 221 to cover its part area. The first light-emitting layer 221 and the second light-emitting layer 222 form light-emitting unit 22 emitting mixed color light according a configured proportion. The distance between the fine metal mark 30 and the array substrate justly generates preset light-emitting area ratio between the second light-emitting layer 222 and the first light-emitting layer 221.

Figure 2B:
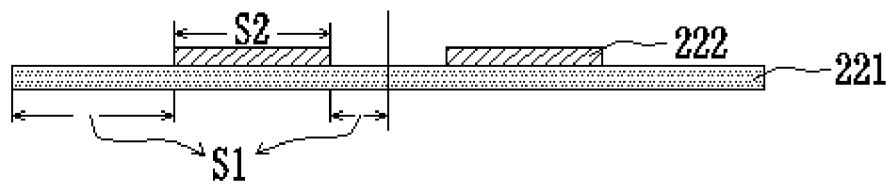
FIG. 2B is a schematic diagram of a light-emitting unit of FIG. 2A according to an embodiment of the present disclosure.

As shown in FIG. 2B, is a schematic diagram of a light-emitting unit within FIG. 2A. The opening area of the second light-emitting layer 222 is defined as an effective light-emitting area S2. Because area of the first light-emitting layer 221 is covered by the second light-emitting layer 222, such that the effective light-emitting area 51 of the first light-emitting layer 221 is corresponding to outside region of the second light-emitting layer 222. Because the first light-emitting layer and the second light-emitting layer are made of a material having a mobility of a first carrier that is greater than a mobility of a second carrier, so that when the hole mobility is greater than the electron mobility, and the effective light-emitting ratio between the first light-emitting layer 221 and the second light-emitting layer 222 is represented as S1:S2, wherein the effective light-emitting ratio is defined as a preset light-emitting ratio.

At step S30, forming a second organic common layer and a cathode layer on a second light-emitting layer.

A second organic common layer (not shown) and a cathode layer (not shown) on light-emitting unit 22 by evaporating with opening metal mark.

Wherein, the first light-emitting layer 221 is back of one surface of the second light-emitting layer 222 to receive the first carrier mobility transmitting from the first organic common layer21, and the second light-emitting layer 222 is back of one surface of the first light-emitting layer 221 to receive the second carrier mobility transmitting from the second organic common layer.

Figure 3A:
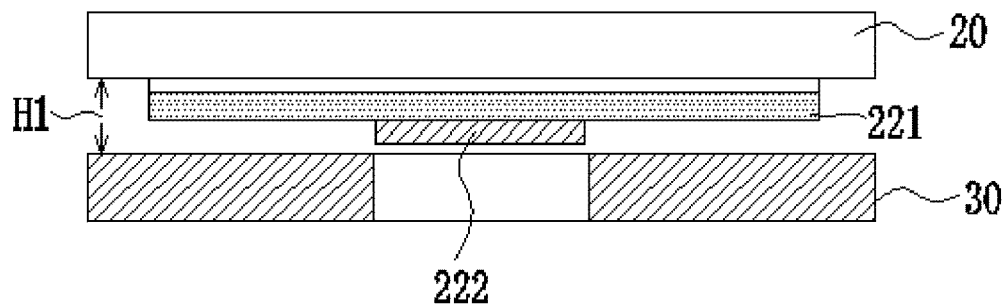
FIGS. 3A~3C are schematic diagrams of two methods of adjusting evaporation area ratio between two kinds of organic light-emitting materials of FIG.2A according to an embodiment of the present disclosure.
Figure 3B:
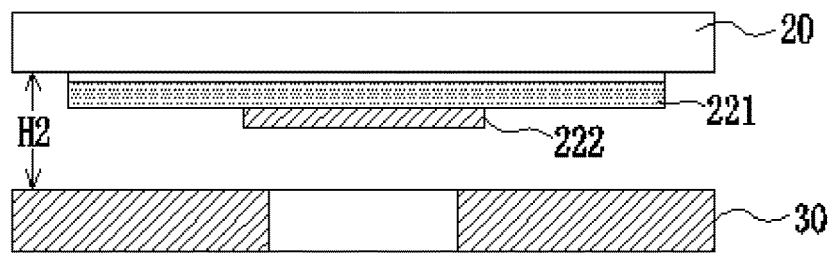
Figure 3C:
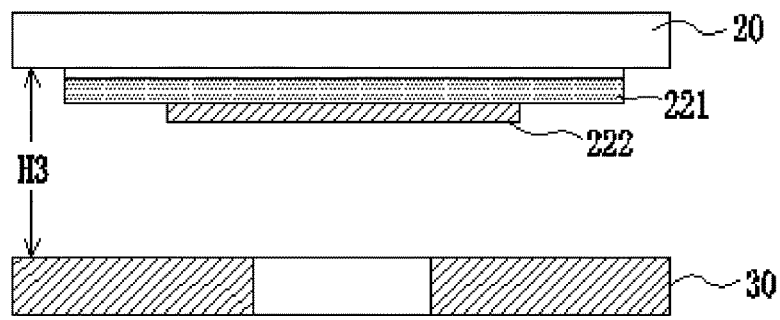

As shown in FIGS. 3A-3C, the figures are method sketches of adjusting evaporation area ratio between two kinds of organic light-emitting materials within FIG.2A. Because the opening areas of different light-emitting materials layers are proportional to the distance between the fine metal mask 30 and the array substrate 20. When the distance growing up from H1 to H3 (H1<H2<H3), the effective area S2 of the second light-emitting layer 222 also grows up. The effective area ratio (S1:S2) between the first light-emitting layer 221 and the second light-emitting layer 222 grows down correspondingly. On the other hand, when the distance between array substrate 20 and the metal mark 30 growing down, the effective area S2 of the second light-emitting layer 222 also grows down. The effective area ratio (S1:S2) between the first light-emitting layer 221 and the second light-emitting layer 222 grows up correspondingly. In other words, the ratio of the light-emitting area of the first light-emitting layer and the light-emitting region of the organic light-emitting material layers is inversely proportional to the distance between the fine metal mask and the array substrate.

Figure 4A:
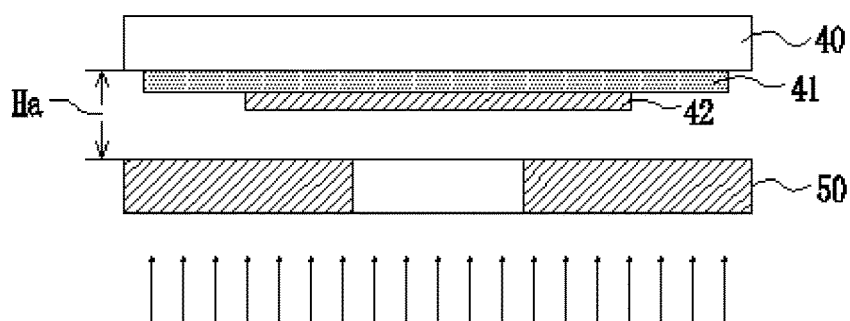
FIGS. 4A~4C is another manufacturing method flow schematic diagram of an organic electrogenerated light-emitting diode device according to an embodiment of the present disclosure.
Figure 4B:
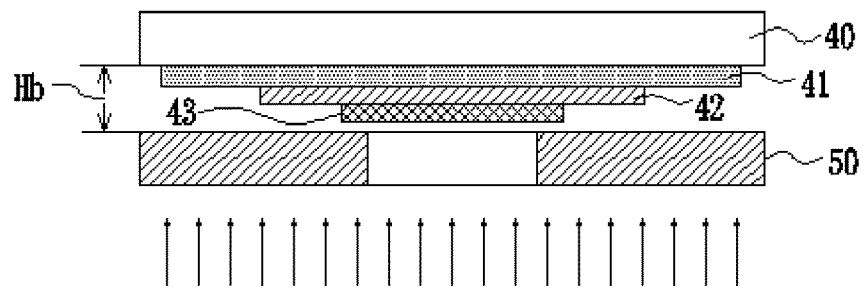
Figure 4C:
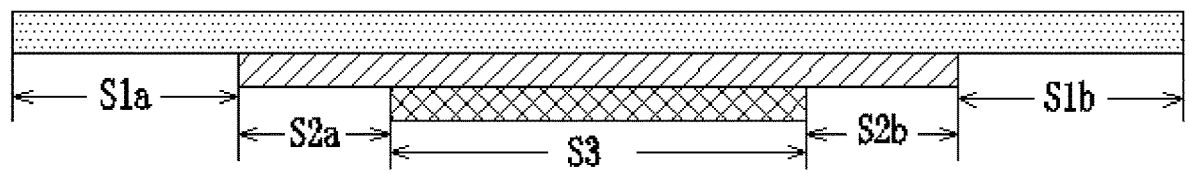

As shown in FIGS. 4A~4C, is another manufacturing method flow schematic diagram of an organic electrogenerated light-emitting diode device. The organic electrogenerated light-emitting diode device can be manufactured by above method mixing several kinds of organic light-emitting materials. The three kinds of organic light-emitting materials showed in the figures just are examples, and more than three kinds of organic light-emitting materials are also contained.

As shown in FIGS. 4A~4B, the distance between the array substrate 40 to the fine metal mark 50 is defined as Ha, evaporating the second light-emitting layer 42 on the first light-emitting layer 41. Then, reducing the distance between the array substrate 40 and the fine metal mark 50 to Hb (Ha>Hb), evaporating the third light-emitting layer 43 on the second light-emitting layer 42. Finally, the mixed color light based on three kinds of organic light-emitting materials can be generated.

As shown in FIG. 4C, the three kinds of organic light-emitting materials are all made of a material having a mobility of a first carrier that is greater than a mobility of a second carrier. For example, when the hole mobility is greater than the electron mobility, and the effective light-emitting ratio of three kinds of organic light-emitting materials is defined as a formula of $(S1a+S1b):(S2a+S2b):S3$. Adjusting the distance between the array substrate 40 and the fine metal mark 50 can change effective light-emitting area ratio of the three kinds of organic light-emitting materials, and then, mixed color light is made up.

The beneficial effects of the manufacturing technics only need one time aligning for the fine metal mark and the array substrate 40, leading to degree process difficulty, reducing production cycle, and improving production yield rate.

Figure 5:
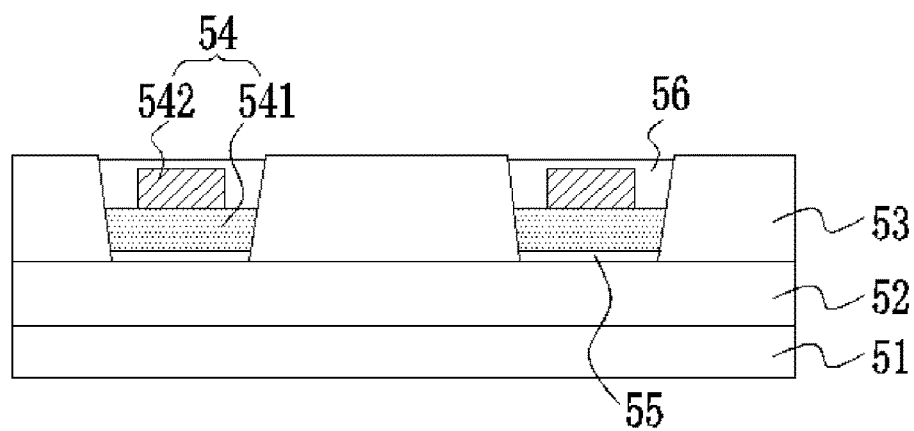
FIG. 5 is a structural schematic diagram of an organic electrogenerated light-emitting diode device according to an embodiment of the present disclosure.

As shown in FIG. 5, the disclosure future provides a display device comprising the organic electrogenerated light-emitting diode device. The organic electrogenerated light-emitting diode device includes: a substrate 51; a thin film transistor layer 52 is above on the substrate 51; a pixel definition layer 53 is above on the thin film transistor layer 52; and a light-emitting unit 54 is configured in the pixel area. The light area at least comprises a first light-emitting layer 541 and a second light-emitting layer 542, the second light-emitting layer 542 is set on the surface of the first light-emitting layer 541, and then, the first light-emitting layer is covered partly. The light-emitting ratio between light-emitting area of the second light-emitting layer 542 and the first light-emitting layer 541 is set according to the preset light-emitting ratio.

The first light-emitting layer 541 and the second light-emitting layer 542 are made of a material having a mobility of a first carrier that is greater than a mobility of a second carrier.

In one embodiment, the first light-emitting layer 541 is covered with the light-emitting area of the organic electrogenerated diode device, namely the pixel region. The first organic common layer 55 is set on the first light-emitting layer 541 back of one surface of the second light-emitting layer 542, the second organic common layer 56 is set on the second light-emitting layer 542 back of one surface of the first light-emitting layer 541, and the second organic common layer 56 is set on surface of the light-emitting unit 54. The first organic common layer 55 is used to transmit the first carrier mobility for the first light-emitting layer 541, and the second organic common layer 56 is used to transmit the first carrier mobility for the second light-emitting layer 542.

The organic electrogenerated light-emitting diode device also including anode layer, cathode layer and other layer, such as a film packaging layer, or a polarizer.

An embodiment of the present disclosure further provides a display device comprising the organic electrogenerated light-emitting diode device. In details, reference may be made to the above description, and no further description is provided herein.

The embodiment of the present disclosure provides the organic electrogenerated light-emitting diode device, its manufacturing method and display device. Light-emitting units with different evaporation area can be obtained by adjusting distance between the fine metal mask and the substrate, and mixed colors light can be realized by adjusting lighting area of different light-emitting materials. The embodiment of the present disclosure only needs a fine metal mark with one kind of opening using the technical scheme, and can obviously reduce using time of metal mask (FMM) and production cost. The manufacturing technic only needs one time aligning for using several light-emitting layers to decrease process difficulty, and reduces production cycle.

The present disclosure has been described with preferred embodiments thereof. The preferred embodiments are not intended to limit the present disclosure, and it is understood that many changes and modifications to the described embodiments can be carried out without departing from the scope and the spirit of the disclosure that is intended to be limited only by the appended claims.

The invention claimed is:

1. A method of manufacturing an electrogenerated organic light-emitting diode device, wherein the organic light-emitting diode device is configured to achieve a mixed light-emitting of at least two kinds of organic light-emitting material layer at a predetermined light-emitting ratio, the method comprising the steps of:

at step S10, providing an array substrate, wherein a pixel region of the array substrate comprises a first organic common layer and a first light-emitting layer;

at step S20, aligning a fine metal mask to the array substrate correspondingly, and adjusting a distance between the fine metal mask and the array substrate to determine opening area of at least two different kinds of organic light-emitting material layer, wherein the opening area is proportional to the distance between the fine metal mask and the array substrate, and at least a second light-emitting layer is formed on the first light-emitting layer; and at step S30, forming a second organic common layer and a cathode layer on a second light-emitting layer.

2. The method according to claim 1, wherein the opening area is determined by a ratio of a light-emitting region of each of the at least two kinds of organic light-emitting material layer and a light-emitting area of the first light-emitting layer.

3. The method according to claim 2, wherein the ratio of the light-emitting area of the first light-emitting layer and the light-emitting region of the organic light-emitting material layer is inversely proportional to the distance between the fine metal mask and the array substrate.

4. The method according to claim 1, wherein the second light-emitting layer is formed on a surface of the first light-emitting layer, and partially covers the surface of the first light-emitting layer.

5. The method according to claim 1, wherein the first light-emitting layer and the second light-emitting layer are made of a material having a mobility of a first carrier that is greater than a mobility of a second carrier, and the first light-emitting layer is back of one surface of the second light-emitting layer to receive the first carrier mobility transmitting from the first organic common layer, and the second light-emitting layer is back of one surface of the first light-emitting layer to receive the second carrier mobility transmitting from the second organic common layer.

6. An organic electrogenerated light-emitting diode device from the manufacturing method according to claim 1, wherein the organic electrogenerated light-emitting diode device including at least the first light-emitting layer and the second light-emitting layer. The second light-emitting layer is formed above the surface of the first light-emitting layer, and partially covers the surface of the first light-emitting layer;

wherein, there is a predetermined light-emitting area ratio between the light-emitting area of the second light-emitting material layer and the first light-emitting layer.

7. The organic electrogenerated light-emitting diode device according to claim 6, wherein the first light-emitting layer and the second light-emitting layer are made of a material which the first carrier mobility is greater than the second carrier mobility.

8. The organic electrogenerated light-emitting diode device according to claim 7, wherein a first organic common layer is set in the first light-emitting layer back of one surface of the second light-emitting layer, and a second organic common layer is set in the second light-emitting layer back of one surface of the first light-emitting layer, and the first organic common layer is used for receiving the first carrier mobility transmitting from the first light-emitting layer, and the second organic common layer is used for receiving the second carrier mobility transmitting from the second light-emitting layer.

9. The organic electrogenerated light-emitting diode device according to claim 6, wherein the first light-emitting layer is covered with the light-emitting area of the organic electrogenerated diode device.

10. A display device comprising the organic electrogenerated light-emitting diode device according to claim 6.

* * * * *

UNITED STATES PATENT AND TRADEMARK OFFICE
CERTIFICATE OF CORRECTION

Page 1 of 1

PATENT NO. : 10,789,884 B2
APPLICATION NO. : 16/326395
DATED : September 29, 2020
INVENTOR(S) : Ming Xiang It is certified that error appears in the above-identified patent and that said Letters Patent is hereby corrected as shown below:

On the Title Page

(30) Foreign Application Priority Data:
Change: (Absent information)
To "November 26, 2018 (CN) 201811418224.9"

Signed and Sealed this
Eighth Day of December, 2020

Andrei Iancu
*Director of the United States Patent and Trademark Office*